United States Patent
Cho

(10) Patent No.: US 7,602,643 B2
(45) Date of Patent: Oct. 13, 2009

(54) NON-VOLATILE MEMORY DEVICES CAPABLE OF READING DATA DURING MULTI-SECTOR ERASE OPERATION, AND DATA READ METHODS THEREOF

(75) Inventor: Ji-ho Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/608,976

(22) Filed: Dec. 11, 2006

(65) Prior Publication Data
US 2008/0123422 A1 May 29, 2008

(30) Foreign Application Priority Data
Nov. 3, 2006 (KR) ............... 10-2006-0108379

(51) Int. Cl.
*G11C 16/04* (2006.01)
(52) U.S. Cl. ............... 365/185.11; 365/185.18; 365/185.29
(58) Field of Classification Search ............ 365/185.18, 365/185.29, 185.11
See application file for complete search history.

(56) References Cited

U.S. PATENT DOCUMENTS

| 5,355,464 | A | * | 10/1994 | Fandrich et al. | ........ | 365/185.29 |
|---|---|---|---|---|---|---|
| 5,867,430 | A | | 2/1999 | Chen et al. | | |
| 6,137,729 | A | | 10/2000 | Choi | | |
| 6,331,950 | B1 | * | 12/2001 | Kuo et al. | ............... | 365/185.18 |
| 6,377,487 | B1 | | 4/2002 | Lee | | |
| 6,377,502 | B1 | | 4/2002 | Honda et al. | | |
| 6,512,693 | B2 | | 1/2003 | Honda et al. | | |
| 6,829,194 | B2 | | 12/2004 | Honda et al. | | |
| 6,856,552 | B2 | * | 2/2005 | Takahashi | ............... | 365/185.29 |
| 6,920,057 | B2 | | 7/2005 | Honda et al. | | |
| 7,126,855 | B2 | | 10/2006 | Honda et al. | | |
| 2006/0256616 | A1 | | 11/2006 | Honda et al. | | |

FOREIGN PATENT DOCUMENTS

| JP | 2001-325795 A | 11/2001 |
|---|---|---|
| KR | 1999-0057219 A | 7/1999 |
| KR | 2000-0051273 A | 8/2000 |
| KR | 2001-0061482 | 7/2001 |

OTHER PUBLICATIONS

Korean Office Action, KR 10-2006-0108379, Dec. 12, 2007.

* cited by examiner

*Primary Examiner*—Hoai V Ho
*Assistant Examiner*—Fernando N Hidalgo
(74) *Attorney, Agent, or Firm*—Myers Bigel Sibley & Sajovec, P.A.

(57) ABSTRACT

The data read method for a non-volatile memory device includes a multi-sector erase operation and a Read While Write (RWW) operation. In the multi-sector erase operation, a plurality of sectors, which are to be erased, are sequentially erased. In the RWW operation, if a read command instructing reading of a sector that is to be read is received while the multi-sector erase operation is being performed, data of the sector that is to be read is read. In the RWW operation, data of a sector that is to be read belonging to a bank including an erased sector, from which data is already erased, is read. Related memory devices are also disclosed.

7 Claims, 4 Drawing Sheets

NON-VOLATILE MEMORY DEVICES CAPABLE OF READING DATA DURING MULTI-SECTOR ERASE OPERATION, AND DATA READ METHODS THEREOF

CROSS-REFERENCE TO RELATED PATENT APPLICATION

This application claims the benefit under 35 USC §119 of Korean Patent Application No. 10-2006-0108379, filed on Nov. 3, 2006, the disclosure of which is hereby incorporated by reference in its entirety as if set forth fully herein.

FIELD OF THE INVENTION

The present invention relates to memory devices and data read methods thereof, and more particularly, to non-volatile memory devices and data read methods performed by the non-volatile memory devices.

BACKGROUND OF THE INVENTION

Non-volatile memory devices are well known to those having skill in the art, and are capable of retaining stored information even when not powered. One widely used non-volatile memory device is a flash memory device that can be erased one block at a time. The design of non-volatile memory devices, including flash memory devices, is well known to those having skill in the art, and need not be described further herein. Unfortunately, in non-volatile memory devices such as flash memory devices, it may be difficult to efficiently read data while an erase operation is being performed.

FIG. 1 is a conceptual view for explaining a conventional data read method by a non-volatile memory device during a multi-sector erase operation. In FIG. 1, it is assumed that the non-volatile memory device includes eight banks, each of which includes a plurality of sectors.

In FIG. 1, if it is assumed that data is currently being erased from a sector ES, data of a sector RS1, from which data is not yet erased, can be read by the non-volatile memory device. However, only status data can be read from the remaining sectors, for example, a sector RS2 of a bank BANK1 including a sector LS1 from which data has already been erased. That is, in the conventional data read method, only after all sectors, which are to be erased, are erased, can data of the remaining sectors, for example, the sector RS2 of the bank BANK1 including the sector LS1, from which data is already erased, be read.

SUMMARY OF THE INVENTION

Some embodiments of the present invention provide data read methods that are performed by a non-volatile memory device including a plurality of banks, each of which includes at least one non-volatile memory cell. These methods comprise reading data from a first bank during a multi-bank erase operation that has already passed through the first bank. In other embodiments, each of the plurality of banks includes a plurality of sectors and data is read from a first sector in a first bank during a multi-sector erase operation that already erased a second sector in the first bank. Methods according to other embodiments of the present invention further comprise reading data from a second bank during the multi-bank erase operation that has not yet reached the second bank. These embodiments may comprise reading data from a third sector in a second bank during the multi-sector erase operation that will erase a fourth sector in the second bank or beyond the second bank, but has not yet erased the fourth sector in the second bank or beyond the second bank.

According to other embodiments of the present invention, data read methods include a multi-sector erase operation and a Read While Write (RWW) operation. In the multi-sector erase operation, a plurality of sectors, which are to be erased, are sequentially erased. In the RWW operation, if a read command instructing reading of a sector that is to be read is received while the multi-sector erase operation is being performed, data of the sector that is to be read is read. In the RWW operation, data of a sector that is to be read belonging to a bank including an erased sector, from which data is already erased, is read.

Embodiments of the present invention have been described above in connection with data read methods. However, in other embodiments, these data read methods may be performed by a controller that is configured to perform the operations that were described above.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
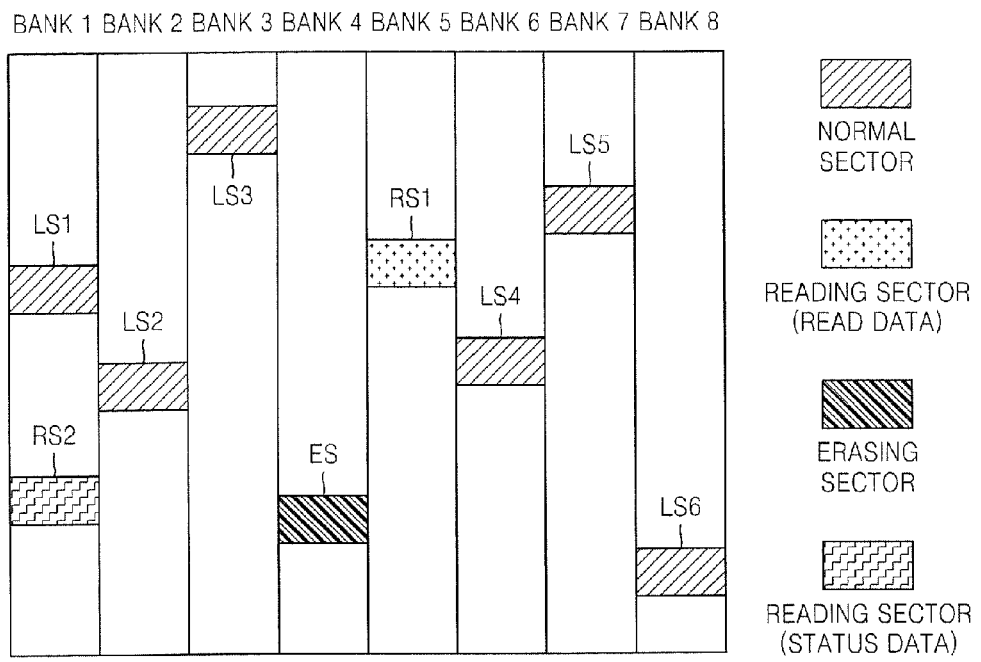
FIG. 1 is a conceptual view for explaining a conventional data read method in a multi-sector erase operation.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Figure 2:
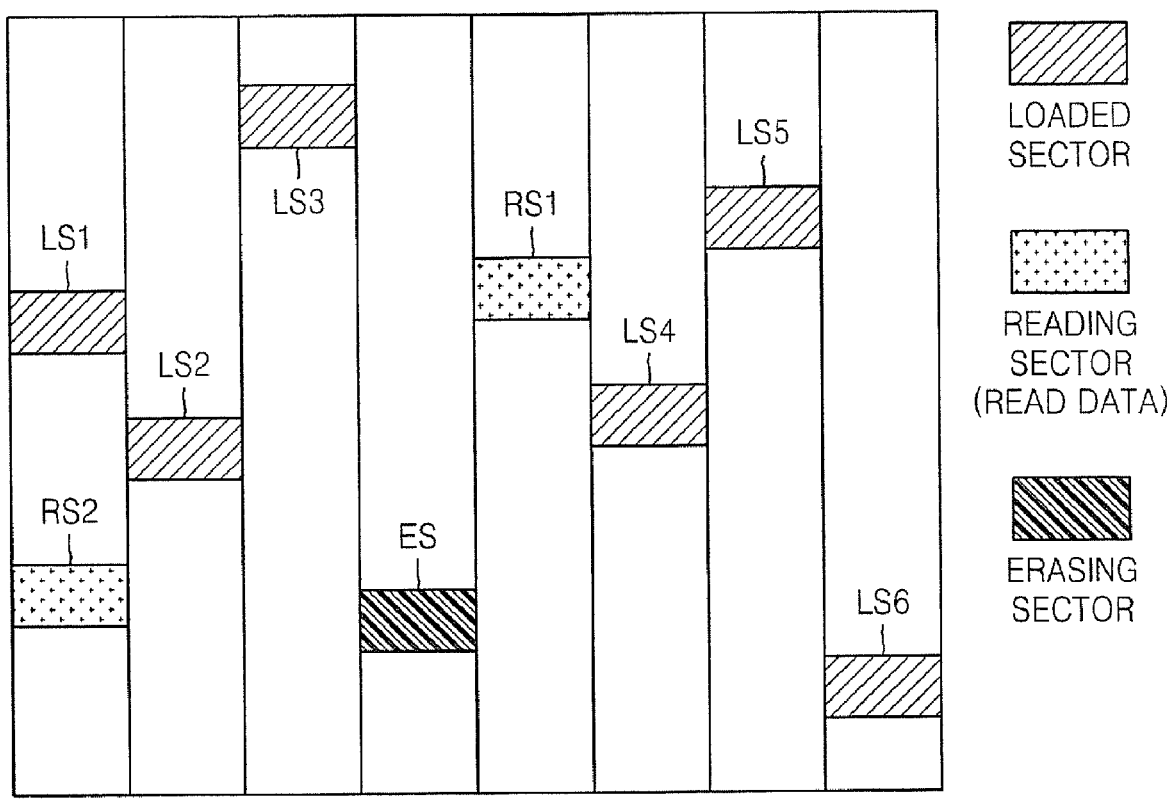
FIG. 2 is a conceptual view of a non-volatile memory device for explaining a data read in a multi-sector erase operation, according to some embodiments of the present invention.

FIG. 2 is a conceptual view of a non-volatile memory device for explaining data read operations in a multi-sector erase operation, according to some embodiments of the present invention. It will be understood that fewer or more banks/sectors may be provided in other embodiments.

In FIG. 2, it is assumed that sectors LS1-LS3 are sectors from which data is already erased, and a sector ES is a sector from which data is currently being erased, and a sector RS1 and sectors LS4-LS6 are sectors from which data is not yet erased, but will be erased, during the multi-sector erase operation.

By comparison, in the conventional data read method, only status data can be read from the remaining sectors, for example, only status data of a sector RS2 of a bank BANK1 including the sector LS1, from which data is already erased.

However, in data read operations according to some embodiments of the present invention, data of the remaining sectors, for example, data of the sector RS2 of the bank BANK1 including the sector LS1, from which data is already erased, and data of the sector RS1, from which data is not yet erased, can both be read.

Figure 5:
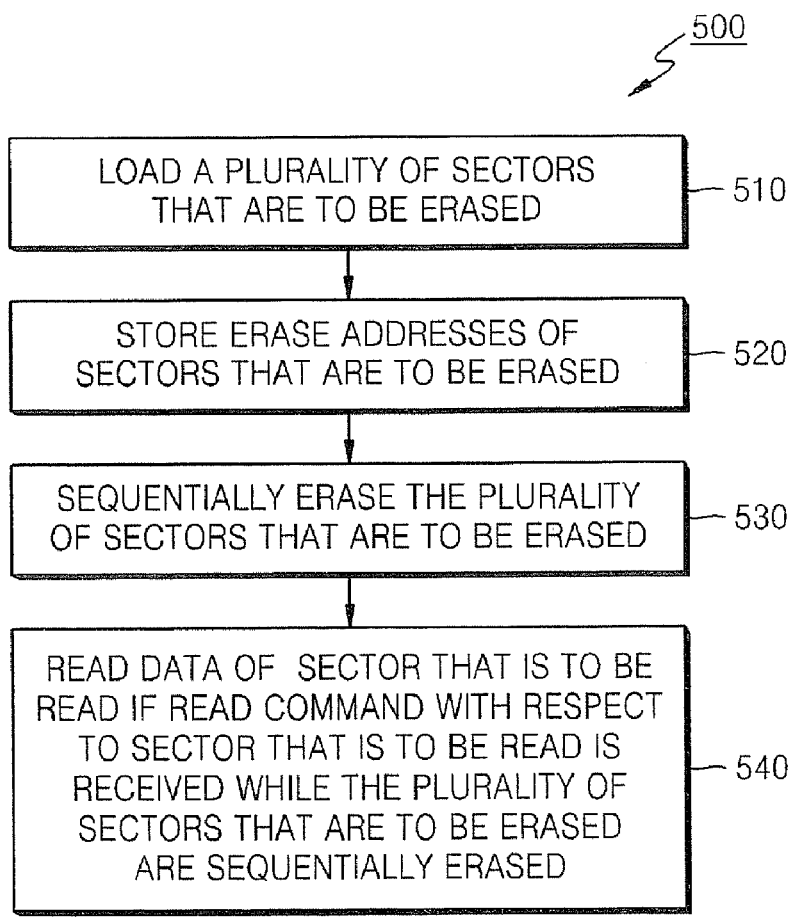
FIG. 5 is a flowchart illustrating a data read operation according to some embodiments of the present invention.

FIG. 5 is a flowchart illustrating data read operations 500 according to some embodiments of the present invention.

Referring to FIG. 5, the data read 500 is performed by a non-volatile memory device including the sectors LS1-LS6, the sector ES, and the sectors RS1-RS2, wherein the sectors LS1-LS6, the sector ES, and the sectors RS1-RS2 each include at least one non-volatile memory cell.

The data read operations 500 include a multi-sector erase Block 530 and a Read While Write (RWW) Block 540. In the multi-sector erase operation Block 530, the sectors LS1-LS6, the sector ES, and the sector RS1 as illustrated in FIG. 2 are sequentially erased. Referring to FIGS. 2 and 5, in the RWW Block 540, when a read command instructing reading of the sector RS2, which is to be read, is received while the multi-sector erase Block 530 is performed, data of the sector RS2, which is to be read, is read.

In the RWW Block 540, data of the sector RS2, which is to be read, of the bank BANK1 including the erase sector LS1, from which data is already erased, can be read.

The data read 500 can further include a latch Block 520. In the latch Block 520, erase addresses of the sectors LS1-LS6, ES, and RS1, which are to be erased, are stored. In the multi-sector erase Block 530, the sectors LS1-LS6, ES, and RS1, which are to be erased, corresponding to the stored erase addresses in the latch Block 520, are sequentially erased.

The multi-sector erase of Block 530 can include sequentially counting addresses of the sectors LS1-LS6, ES, and RS1; comparing a counted address with the stored erase addresses; and if the counted address matches (is the same as) one of the stored erase addresses, erasing a sector corresponding to the counted address.

For example, addresses of sectors are counted from a first sector (not shown) of the bank BANK1. Then, the counted address is compared with the erase addresses stored in the latch operation of Block 520. As a comparison result, if the counted address matches one of the stored erase addresses, data of a sector corresponding to the counted address is erased. Then, again, the addresses of the sectors are counted. By repeating this process, the multi-sector erase operation of erasing the sectors LS1-LS6, ES, and RS1 is performed.

The data read 500 can further include loading the sectors LS1-LS6, ES, and RS1, which are to be erased. (Block 510). In the multi-sector erase operation of Block 530, the loaded sectors LS1-LS6, ES, and RS1, which are to be erased, are sequentially erased.

Figure 3:
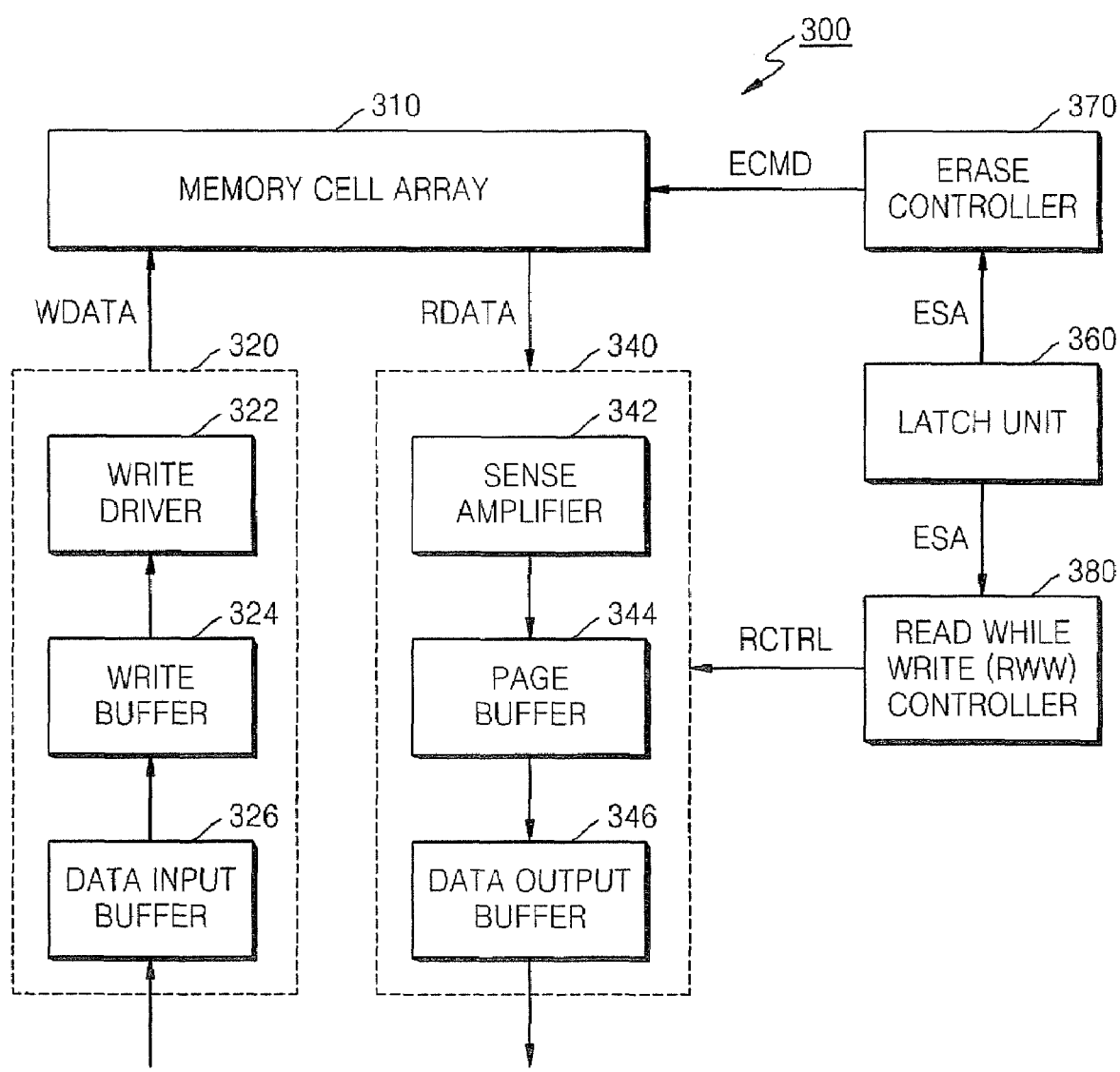
FIG. 3 is a block diagram of a non-volatile memory device according to some embodiments of the present invention.

FIG. 3 is a block diagram of a non-volatile memory device 300 according to some embodiments of the present invention.

Referring to FIG. 3, the non-volatile memory device 300 includes a non-volatile memory cell array 310 and a RWW controller 380. The RWW controller 380, also referred to simply as a controller, may be configured to perform operations of FIG. 5 that were described above. In particular, the non-volatile memory cell array 310 includes a plurality of sectors, wherein each of the sectors includes at least one non-volatile memory cell. In a multi-sector erase operation in which the plurality of sectors are erased, if a read command is received before all sectors are erased, the RWW controller 380 reads data of a sector, which is to be read, indicated by the read command. The RWW controller 380 can read data of the sector, which is to be read, belonging to a bank including erased sectors from which data is already erased.

The non-volatile memory device 300 can further include a latch unit 360 and an erase controller 370. The latch unit 360 stores erase addresses ESA of sectors, from which data is to be erased. The erase controller 370 sequentially erases data of the sectors, which are to be erased, corresponding to the erase addresses ESA. It will be understood that at least some of the functionality of the erase controller 370 may be included in the RWW controller 380.

Still referring to FIG. 3, the non-volatile memory device 300 further includes a write unit 320 including a write driver 322, a write buffer 324, and a data input buffer 326 and configured to perform a data write operation; and a read unit 340 including a sense amplifier 342, a page buffer 344, and a data output buffer 346 and configured to perform a data read operation.

Figure 4:
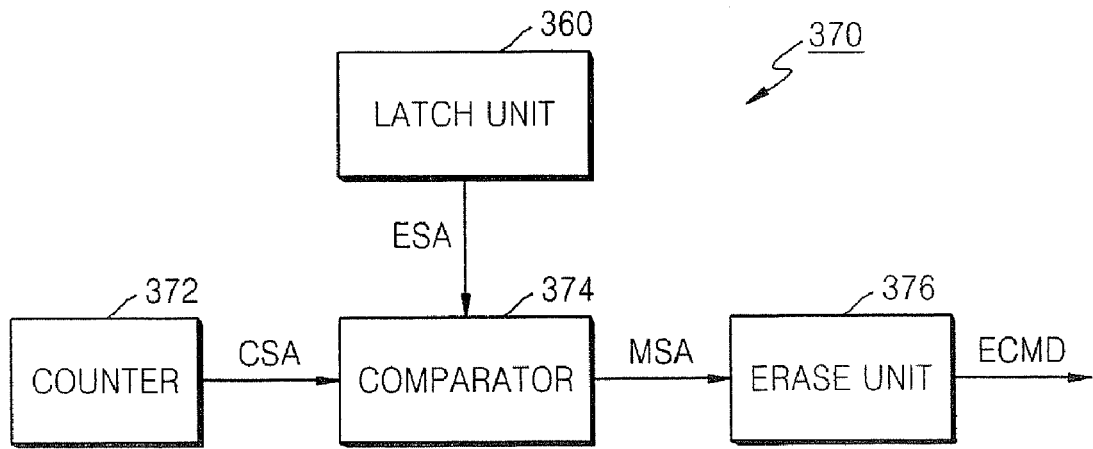
FIG. 4 is a detailed block diagram of an erase controller of a non-volatile memory device in FIG. 3, according to some embodiments of the present invention.

FIG. 4 is a detailed block diagram of an erase controller 370 of a non-volatile memory device 300 illustrated in FIG. 3, according to some embodiments of the present invention.

Referring to FIG. 4, the erase controller 370 includes a counter 372, a comparator 374, and an erase unit 376. In FIG. 4, for convenience of description, the latch unit 360 of the non-volatile memory device 300 of FIG. 3 is also illustrated.

The counter 372 of the erase controller 370 sequentially counts addresses of all sectors. The comparator 374 compares a counted address CSA with the erase addresses ESA stored in the latch unit 360. If the counted address CSA matches one of the erase addresses ESA stored in the latch unit 360, the erase unit 376 of the erase controller 370 erases data of a sector corresponding to the counted address CSA.

As described above, non-volatile memory devices and data read methods, according to some embodiments of the present invention, can increase RWW efficiency.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A data read method performed by a non-volatile memory device including a plurality of sectors, each of the sectors including at least one non-volatile memory cell, the method comprising:
sequentially erasing data of a plurality of sectors, which are to be erased; and
if a read command instructing reading of a sector that is to be read is received while the plurality of sectors, which are to be erased, are being erased, reading data of the sector that is to be read while the plurality of sectors, which are to be erased, are being erased,
wherein, during the reading of the data of the sector that is to be read, if the sector that is to be read belongs to a bank including an erased sector from which data is already erased, the data of the sector that is to be read is read while the plurality of sectors, which are to be erased, are being erased.

2. The data read method of claim 1, further comprising storing a plurality of erase addresses of the plurality of sectors, which are to be erased, and wherein sequentially erasing data of the plurality of sectors, which are to be erased comprises sequentially erasing the plurality of sectors, which are to be erased, corresponding to the stored erase addresses.

3. The data read method of claim 2, wherein sequentially erasing of the data of the plurality of sectors, which are to be erased, comprises:
sequentially counting addresses of the plurality of sectors, which are to be erased;
comparing a counted address with the stored erase addresses; and
if the counted address matches one of the stored erase addresses, erasing data of a sector corresponding to the counted address.

4. The data read method of claim 1, further comprising:
loading the plurality of sectors, which are to be erased,
wherein, sequentially erasing data of the plurality of sectors comprises sequentially erasing the loaded sectors, which are to be erased.

5. A non-volatile memory device comprising:
a non-volatile memory cell array including a plurality of sectors, each of the sectors including at least one non-volatile memory cell; and
a Read While Write (RWW) controller configured to read data of a sector that is to be read as indicated by a read command when the read command is received before other sectors, which are to be erased, are all erased, while a multi-sector erase operation in which the plurality of sectors are erased is being performed,
wherein the RWW controller is configured to read the data of the sector that is to be read, if the sector that is to be read belongs to a bank including an other erased sector, from which data is already erased, while the multi-sector erase operation in which the plurality of sectors are erased, is being performed.

6. The non-volatile memory device of claim 5, further comprising:
a latch unit configured to store erase addresses of the sectors, which are to be erased; and
an erase controller configured to sequentially erase data of the sectors, which are to be erased, corresponding to the stored erase addresses.

7. The non-volatile memory device of claim 6, wherein the erase controller comprises:
a counter configured to sequentially count addresses of the plurality of sectors;
a comparator configured to compare a counted address with the stored erase addresses; and
an erase unit configured to erase a sector corresponding to the counted address, if the counted address matches one of the stored erase addresses.

\* \* \* \* \*